(12) United States Patent
Sakakura

(10) Patent No.: US 9,721,599 B2
(45) Date of Patent: Aug. 1, 2017

(54) SUSPENSION BOARD WITH CIRCUIT AND PRODUCING METHOD THEREOF

(71) Applicant: NITTO DENKO CORPORATION, Osaka (JP)

(72) Inventor: Takatoshi Sakakura, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 14/730,557

(22) Filed: Jun. 4, 2015

(65) Prior Publication Data
US 2015/0380030 A1 Dec. 31, 2015

(30) Foreign Application Priority Data
Jun. 26, 2014 (JP) ................................. 2014-131590

(51) Int. Cl.
*H05K 1/11* (2006.01)
*H05K 1/18* (2006.01)
(Continued)

(52) U.S. Cl.
CPC ............ *G11B 5/4873* (2013.01); *G11B 5/483* (2015.09); *G11B 5/486* (2013.01); *H05K 1/183* (2013.01);
(Continued)

(58) Field of Classification Search
CPC .... H01L 24/50; H05K 1/0277; H05K 1/0278; H05K 1/028; H05K 1/0281; H05K 1/0283; H05K 1/0393; H05K 1/118; H05K 1/147; H05K 1/148; H05K 1/189; H05K 2201/042; H05K 2201/046; H05K 2201/05; H05K 1/021; H05K 1/0212; H05K 1/0215; H05K 1/023; H05K 1/0231; H05K 1/0233; H05K 1/0234; H05K 1/0295; H05K 1/14; H05K 1/141; H05K 1/142; H05K 1/144;
(Continued)

(56) References Cited

U.S. PATENT DOCUMENTS 5,551,628 A * 9/1996 Van Gerven ......... B23K 35/025
148/24
2002/0075606 A1* 6/2002 Nishida ................ G11B 5/5552
360/294.4

(Continued)

FOREIGN PATENT DOCUMENTS

JP 2012-099204 A 5/2012

*Primary Examiner* — Ishwarbhai B Patel
(74) *Attorney, Agent, or Firm* — Edwards Neils LLC; Jean C. Edwards, Esq.

(57) ABSTRACT

A suspension board with circuit includes a metal supporting board, an insulating base layer formed on one side of the metal supporting board in a thickness direction thereof, a conductive layer, and an insulating cover layer formed on the one side of the insulating base layer to cover the conductive layer. Either one of the insulating base layer and the insulating cover layer includes an opening extending therethrough in the thickness direction. The conductive layer includes a wire formed on the one side of the insulating base layer, and a connection terminal electrically connected to the wire and exposed from the opening to be capable of electrical connection to an electronic element. The suspension board with circuit further includes a protective layer for protecting the connection terminal exposed from the opening.

7 Claims, 10 Drawing Sheets

(51) Int. Cl.
*G11B 5/48* (2006.01)
*H05K 3/40* (2006.01)
*H05K 1/05* (2006.01)

(52) U.S. Cl.
CPC .......... *H05K 3/4007* (2013.01); *H05K 1/056* (2013.01); *H05K 2201/10083* (2013.01)

(58) Field of Classification Search
CPC .......... H05K 1/145; H05K 1/16; H05K 1/162; H05K 1/165; H05K 1/181; H05K 1/182; H05K 1/183; H05K 1/184; H05K 1/185; H05K 2201/0317; H05K 2201/041; H05K 2201/049; H05K 2201/09763; H05K 2201/09872; H05K 2201/10446; H05K 2201/10454; H05K 2201/10462; H05K 2201/10469; H05K 2201/10484; H05K 2201/10492; H05K 2201/105; H05K 2201/10674; H05K 3/30; H05K 3/32; H05K 3/341; H05K 3/3415; H05K 3/3421; H05K 3/3431; H05K 3/36; H05K 3/46; H05K 1/0243; G11B 5/4853; G11B 5/486
See application file for complete search history.

(56) References Cited

U.S. PATENT DOCUMENTS

| | | | |
|---|---|---|---|
| 2012/0087041 A1* | 4/2012 | Ohsawa | G11B 5/4826 360/234.5 |
| 2014/0057394 A1* | 2/2014 | Ramasamy | H01L 25/50 438/113 |
| 2014/0104722 A1* | 4/2014 | Wright | H01L 41/0946 360/75 |

* cited by examiner

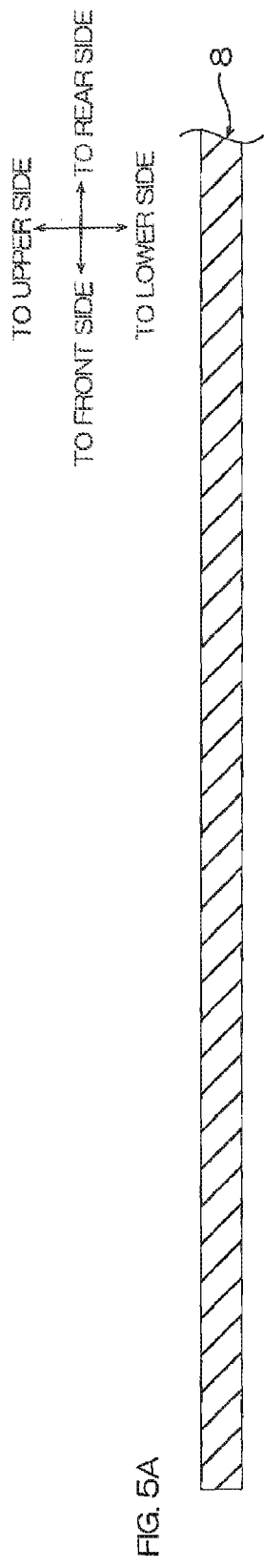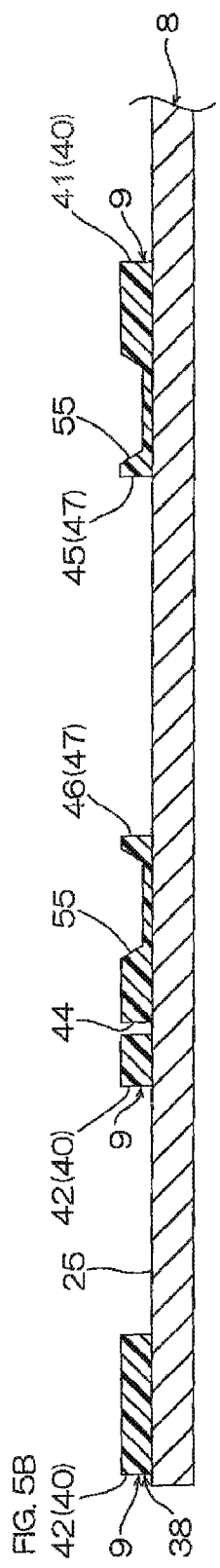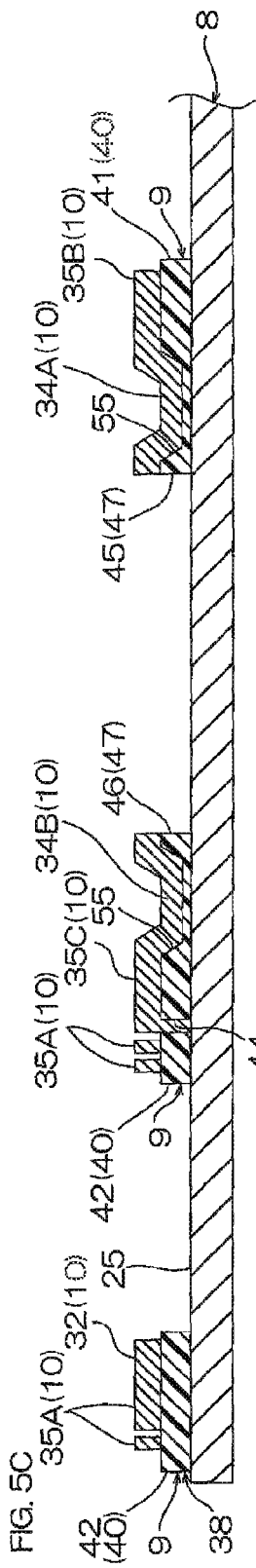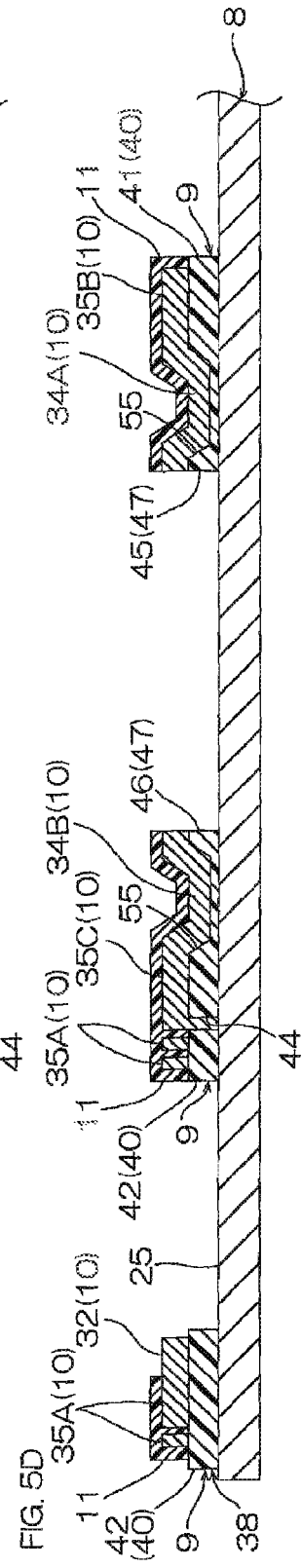

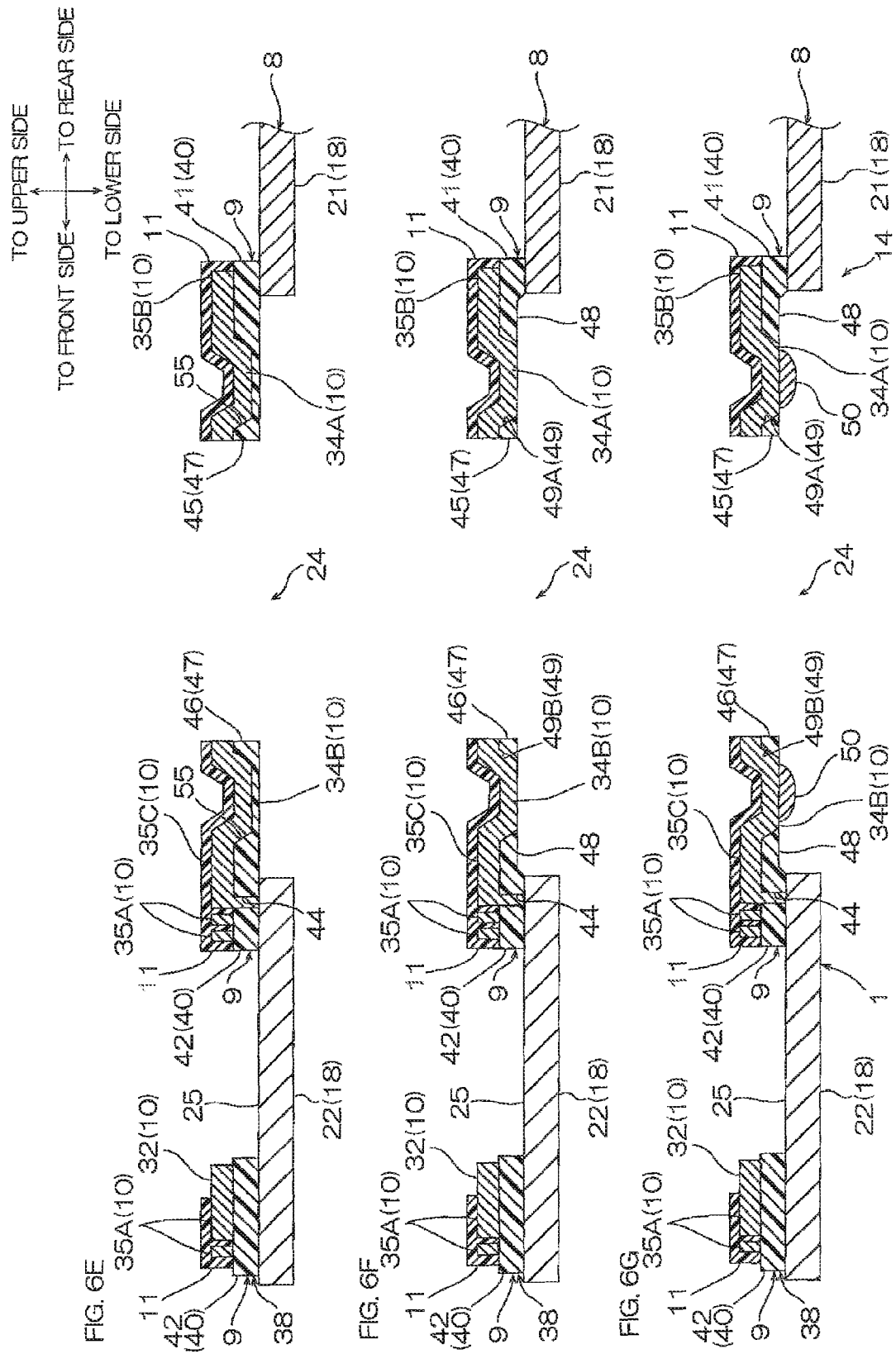

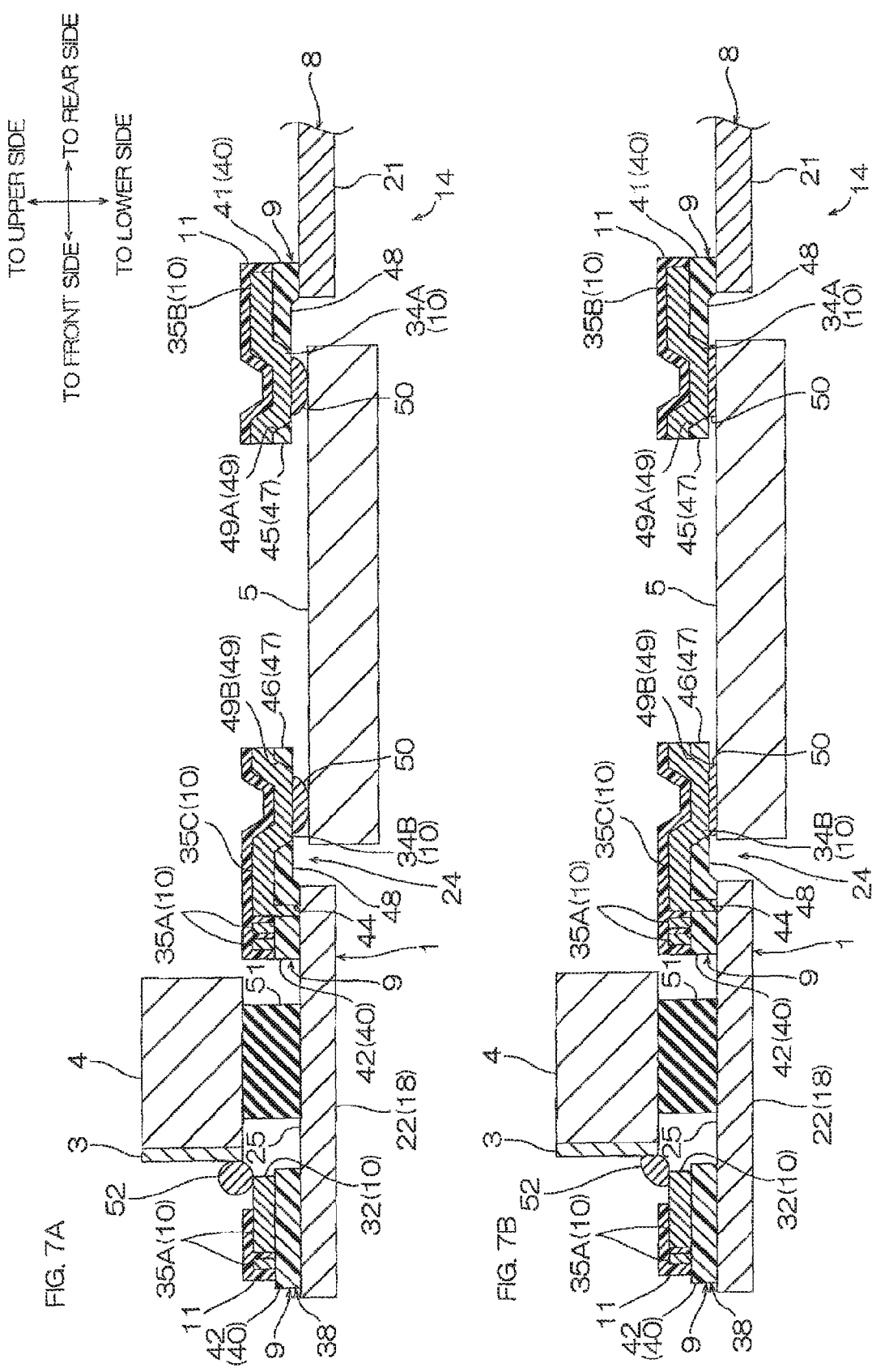

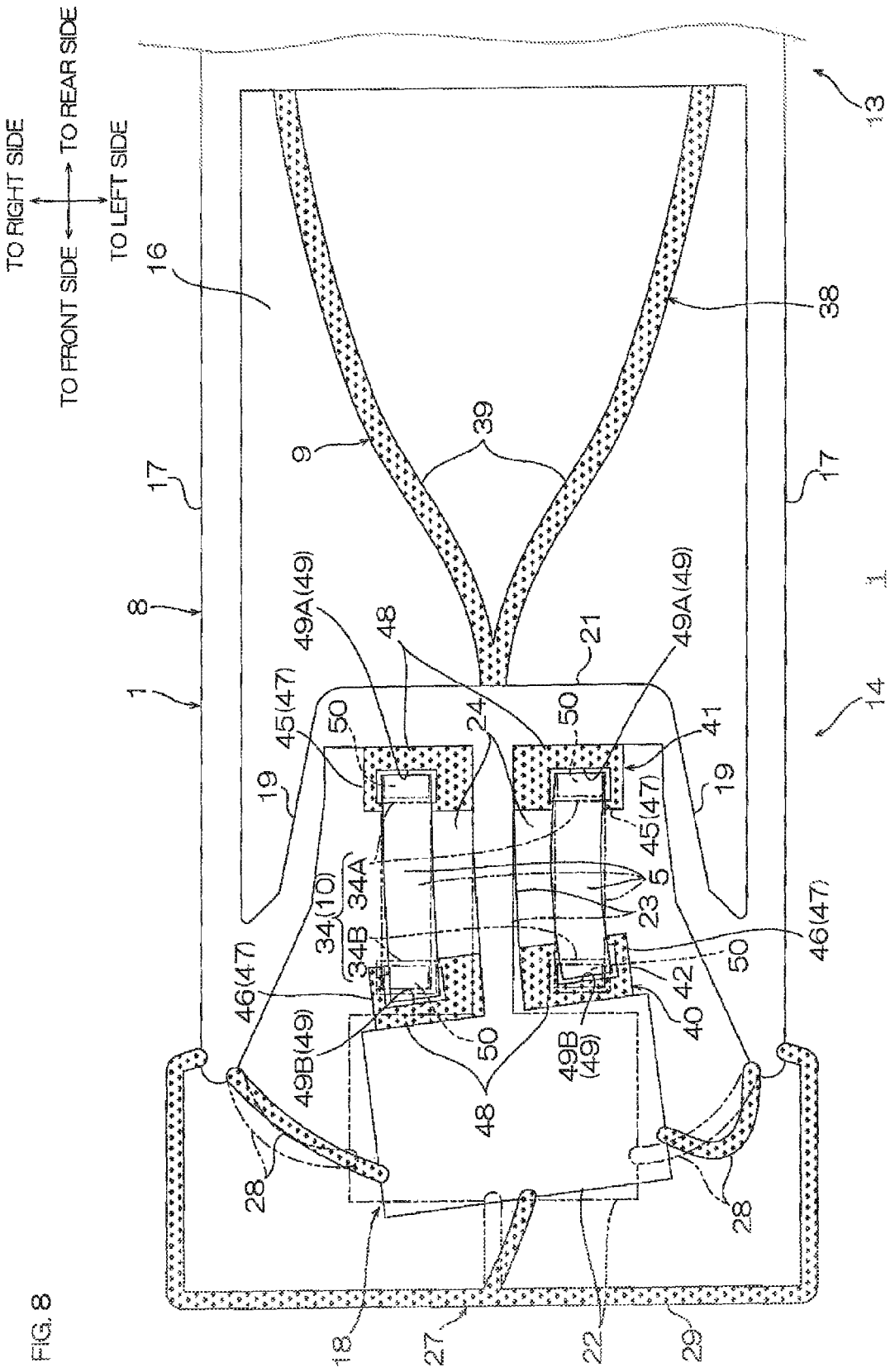

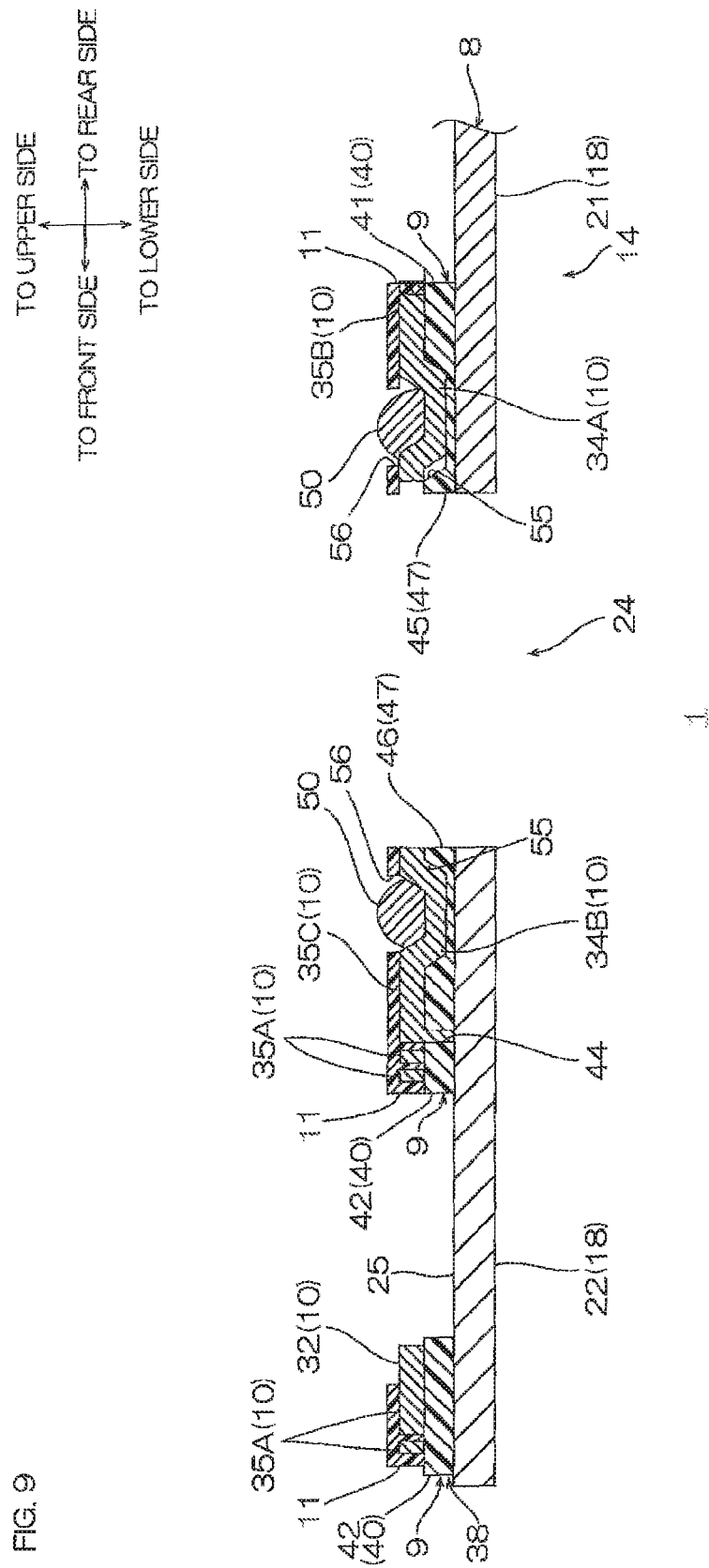

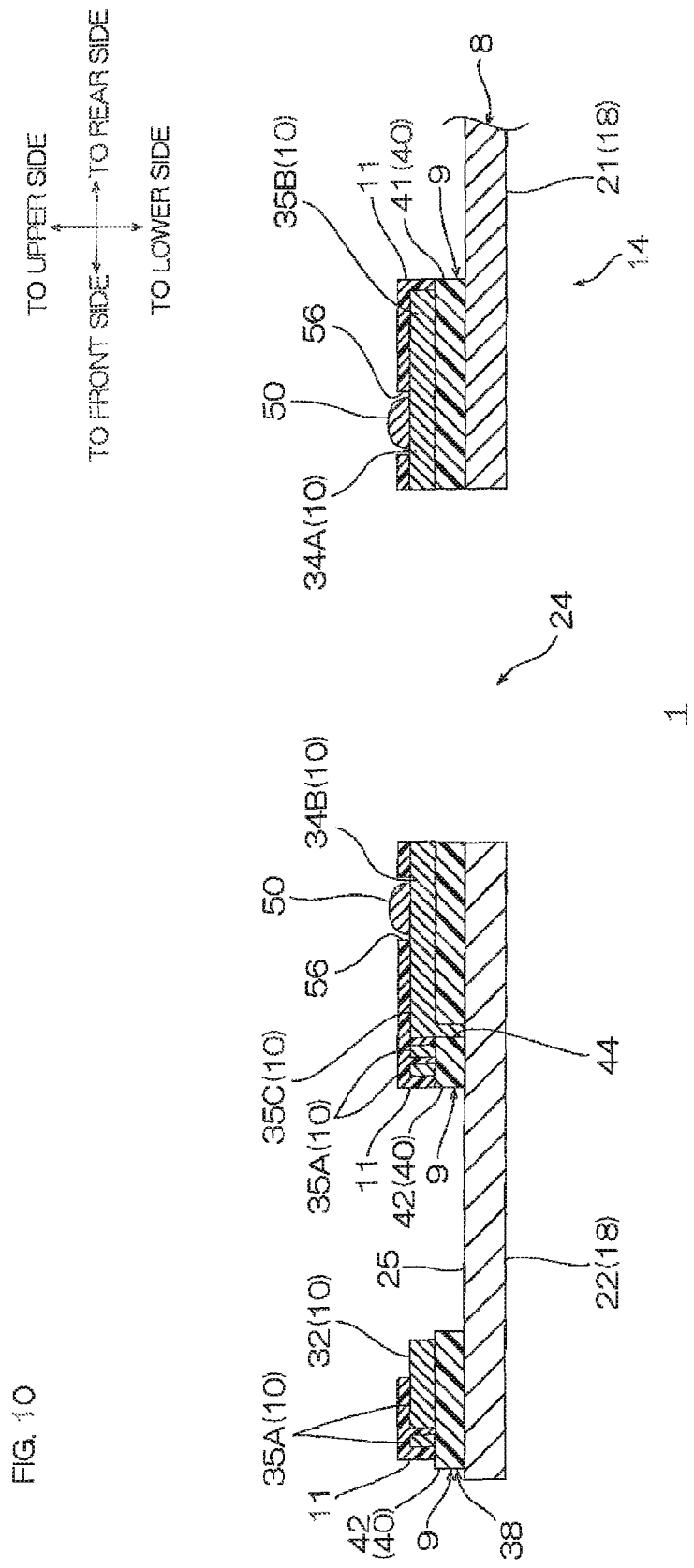

SUSPENSION BOARD WITH CIRCUIT AND PRODUCING METHOD THEREOF

CROSS-REFERENCE TO RELATED APPLICATION

The present application claims priority from Japanese Patent Application No. 2014-131590 filed on Jun. 26, 2014, the content of which is herein incorporated by reference into this application.

BACKGROUND OF THE INVENTION

Field of the Invention

The present invention relates to a suspension board with circuit, and particularly to a suspension board with circuit used in a hard disk drive and a producing method thereof.

Description of the Related Art

Conventionally, it has been known to provide a magnetic head on the gimbal portion of a suspension board with circuit and move the gimbal portion to accurately and finely adjust the position and angle of the magnetic head.

As such a suspension board with circuit, a suspension board with circuit has been known in which piezoelectric elements (piezo-elements) are electrically connected to connection terminals and, through the extending/contracting operation of the piezoelectric elements, a gimbal portion is moved to accurately and finely adjust the position and angle of a magnetic head (see, e.g., Japanese Unexamined Patent No. 2012-099204).

SUMMARY OF THE INVENTION

However, to accurately and finely adjust the position and angle of the magnetic head in the suspension board with circuit described in Japanese Unexamined Patent No. 2012-099204, the piezoelectric elements need to be stably operated. On the other hand, when the deposition of a foreign material, corrosion, or the like occurs at the connection terminals before the piezoelectric elements are connected thereto, the reliability of connection to the piezoelectric elements deteriorates to destabilize the operation of the piezoelectric elements.

It is therefore an object of the present invention to provide a suspension board with circuit which allows an improvement in the reliability of connection to an electronic element.

A suspension board with circuit of the present invention includes a metal supporting board, an insulating base layer formed on one side of the metal supporting board in a thickness direction thereof, a conductive layer, and an insulating cover layer formed on the one side of the insulating base layer in the thickness direction to cover the conductive layer. Either one of the insulating base layer and the insulating cover layer includes an opening extending therethrough in the thickness direction. The conductive layer includes a wire formed on the one side of the insulating base layer in the thickness direction, and a connection terminal electrically connected to the wire and exposed from the opening to be capable of electrical connection to an electronic element. The suspension board with circuit further includes a protective layer for protecting the connection terminal exposed from the opening.

In such a suspension board with circuit, the connection terminal is exposed from the opening, but is protected by the protective layer. This can suppress the deposition of a foreign material on the connection terminal and the corrosion of the connection terminal during the period after the production of the suspension board with circuit before the connection thereof to the electronic element.

As a result, it is possible to maintain the quality of the connection terminal and improve the reliability of the connection thereof to the electronic element.

In the suspension board with circuit of the present invention, it is preferable that the electronic element is a piezoelectric element, and the connection terminal is displaced as a result of driving the piezoelectric element.

In the suspension board with circuit, as a result of driving the piezoelectric element, the connection terminal is displaced according to the driven piezoelectric element. Accordingly, the connection terminal is required to have connection reliability higher than that required of a connection terminal which is not displaced. However, since the connection terminal is protected by the protective layer, the connection terminal can reliably be connected to the electronic element.

In the suspension board with circuit of the present invention, it is preferable that the protective layer is made of a conductive material.

In such a suspension board with circuit, the connection terminal can be electrically connected to the electronic element via the protective layer.

Therefore, using the protective layer, the electronic element can be mounted on the suspension board with circuit.

In the suspension board with circuit of the present invention, it is preferable that the protective layer is made of a solder.

On such a suspension board with circuit, the electronic element can be mounted by a simple and easy method which brings the electronic element into contact with the protective layer made of the solder and causes the protective layer to reflow.

As a result, it is possible to simplify the step for mounting the electronic element on the suspension board with circuit and reduce cost.

In the suspension board with circuit of the present invention, it is preferable that the opening is formed in the insulating base layer so as not to overlap the metal supporting board when projected in the thickness direction, the connection terminal fills the opening, and the protective layer protects, from the other side thereof in the thickness direction, the connection terminal exposed to the other side thereof in the thickness direction.

In such a suspension board with circuit it is possible to protect the connection terminal exposed from the other side of the opening in the thickness direction and suppress the deposition of a foreign material on the connection terminal and the corrosion of the connection terminal during the period after the production of the suspension board with circuit before the connection thereof to the electronic element.

In the suspension board with circuit of the present invention, it is preferable that the insulating base layer includes a recessed portion which is recessed in a peripheral edge portion of the opening from a surface of the insulating base layer which is located on the other side thereof in the thickness direction toward the one side thereof in the thickness direction, and, in the thickness direction, the recessed portion is located at the one side of a surface of the metal supporting board which is located on the one side thereof in the thickness direction.

In such a suspension board with circuit, the recessed portion is formed. As a result in the thickness direction, the connection terminal is located on the one side of the surface of the metal supporting board which is located on the one side thereof in the thickness direction. This can inhibit an external member from coming into contact with the connection terminal.

When the protective layer is made of a conductive material, it is possible to bring the electronic element into contact with the protective layer and easily electrically connect the connection terminal to the electronic element via the protective layer.

In addition, by adjusting the height of the protective layer in the thickness direction, it is possible to adjust the position of the electronic element in the thickness direction.

This allows the electronic element to be mounted at any position on the suspension board with circuit.

In the suspension board with circuit of the present invention, it is preferable that the protective layer is placed in the recessed portion, and, in the thickness direction, the other side of the protective layer in the thickness direction is located at the other side of the surface of the metal supporting board which is located on the one side thereof in the thickness direction.

In such a suspension board with circuit, the protective layer located in the recessed portion is formed large such that, in the thickness direction, the other side of the protective layer in the thickness direction thereof is located on the other side of the surface of the metal supporting board which is located on the one side thereof in the thickness direction. This allows the protective layer to more reliably protect the connection terminal.

In the suspension board with circuit of the present invention, it is preferable that the insulating base layer includes a depressed portion which is recessed from the one side of the insulating base layer in the thickness direction toward the other side thereof in the thickness direction and filled with the connection terminal, the opening is formed in the insulating cover layer so as to overlap the depressed portion when projected in the thickness direction, and the protective layer protects, from the one side thereof in the thickness direction, the connection terminal exposed to the one side thereof in the thickness direction.

In such a suspension board with circuit, the connection terminal fills the depressed portion of the insulating base layer. As a result, the connection terminal is located so as to be recessed toward the other side with respect to the wire in the thickness direction.

This can inhibit an external member from coming into contact with the connection terminal.

In addition, the protective layer is allowed to protect the connection terminal exposed from the one side of the opening in the thickness direction and suppress the deposition of a foreign material on the connection terminal and the corrosion of the connection terminal during the period after the production of the suspension board with circuit before the connection thereof to the electronic element.

In the suspension board with circuit of the present invention, it is preferable that the protective layer is placed in the opening, and, in the thickness direction, the one side of the protective layer in the thickness direction is located at the one side of a surface of the insulating cover layer which is located on the one side thereof in the thickness direction.

In such a suspension board with circuit, the protective layer placed in the opening is formed large such that, in the thickness direction, the one side of the protective layer in the thickness direction is located on the one side of the surface of the insulating cover layer which is located on the one side thereof in the thickness direction. This allows the protective layer to more reliably protect the connection terminal.

A method of producing a suspension board with circuit of the present invention includes the steps of preparing a metal supporting board, laminating on one side of the metal supporting board in a thickness direction thereof, an insulating layer including a depressed portion which is recessed from the one side of the insulating layer in the thickness direction toward the other side thereof in the thickness direction, laminating a conductive layer including a wire formed on the one side of the insulating layer in the thickness direction, and a connection terminal electrically connected to the wire and filling the depressed portion to be capable of electrical connection to an electronic element, partially removing the metal supporting board to expose a surface of the insulating layer which is located on the other side thereof in the thickness direction in a region which overlaps at least the depressed portion when projected in the thickness direction, partially removing the insulating layer to allow the depressed portion to extend through the insulating layer in the thickness direction and form an opening so as to expose a surface of the connection terminal which is located on the other side thereof in the thickness direction, while forming a recessed portion which is recessed in a peripheral edge portion of the opening from the surface of the insulating layer which is located on the other side thereof in the thickness direction toward the one side thereof in the thickness direction, and forming a protective layer made of a conductive material on the surface of the connection terminal which is located on the other side thereof in the thickness direction and exposed from the opening.

According to such a method of producing a suspension board with circuit, the connection terminal fills the depressed portion of the insulating layer, while the surface of the insulating layer which is located on the other side thereof is partially removed. This allows simultaneous formation of the opening and the recessed portion.

In addition, since the recessed portion is formed, in the thickness direction, the connection terminal is located on the one side of the surface of the metal supporting board which is located on the one side thereof in the thickness direction. This can inhibit an external member from coming into contact with the connection terminal.

Since the protective layer is made of a conductive material, it is possible to bring the electronic element into contact with the protective layer and easily electrically connect the connection terminal to the electronic element via the protective layer.

In addition, by adjusting the height of the protective layer in the thickness direction, it is possible to adjust the position of the electronic element in the thickness direction.

This allows the electronic element to be mounted at any position on the suspension board with circuit.

A method of producing a suspension board with circuit of the present invention includes the steps of preparing a metal supporting board, laminating, on one side of the metal supporting board in a thickness direction thereof, an insulating base layer including a depressed portion which is recessed from the one side of the insulating base layer in the thickness direction toward the other side thereof in the thickness direction, laminating a conductive layer including a wire formed on the one side of the insulating base layer in the thickness direction, and a connection terminal electrically connected to the wire and filling the depressed portion to be capable of electrical connection to an electronic element, forming an insulating cover layer covering the wire and including an opening which exposes the connection terminal on the one side of the insulating base layer in the thickness direction, and forming a protective layer made of a conductive material on a surface of the connection terminal exposed from the opening which is located the one side thereof in the thickness direction.

According to such a method of producing a suspension board with circuit, the connection terminal fills the depressed portion of the insulating base layer. Consequently, the connection terminal is formed to be recessed toward the other side with respect to the wire in the thickness direction.

As a result, even when the insulating cover layer is formed with the opening which exposes the connection terminal, the connection terminal is located so as to be recessed toward the other side with respect to the wire in the thickness direction. This can inhibit an external member from coming into contact with the connection terminal.

Since the protective layer is made of a conductive material, it is possible to bring the electronic element into contact with the protective layer and easily electrically connect the connection terminal to the electronic element via the protective layer.

In addition, by adjusting the height of the protective layer in the thickness direction, it is possible to adjust the position of the electronic element in the thickness direction.

This allows the electronic element to be mounted at any position on the suspension board with circuit.

BRIEF DESCRIPTION OF THE DRAWINGS

FIGS. 5A to 5D are process views for illustrating a method of producing the suspension board with circuit, FIG. 5A showing the step of preparing a metal supporting board, FIG. 5B showing the step of preparing an insulating base layer, FIG. 5C showing the step of forming a conductive layer, and FIG. 5D showing the step of preparing an insulating cover layer;

FIGS. 6E to 6G are process views for illustrating the method of producing the suspension board with circuit subsequently to FIG. 5D, FIG. 6E showing the step of trimming the metal supporting board, FIG. 6F showing the stop of partially removing the insulating base layer to form a recessed portion and terminal openings, and FIG. 6G showing the step of forming a protective layer;

FIGS. 7A and 7B are process views for illustrating the mounting of a slider and piezo-elements on the suspension board with circuit obtained in FIG. 6G, FIG. 7A showing the step of setting the slider and the piezo-elements to the suspension board with circuit, and FIG. 7B showing a reflowing step;

FIG. 8 shows a bottom view of the stage of the gimbal portion shown in FIG. 2 that has been swung;

FIG. 9 shows a cross-sectional view of the gimbal portion of a suspension board with circuit in a second embodiment of the present invention; and FIG. 10 shows a cross-sectional view of the gimbal portion of a suspension board with circuit in a third embodiment of the present invention.

DETAILED DESCRIPTION OF THE INVENTION

Figure 1:
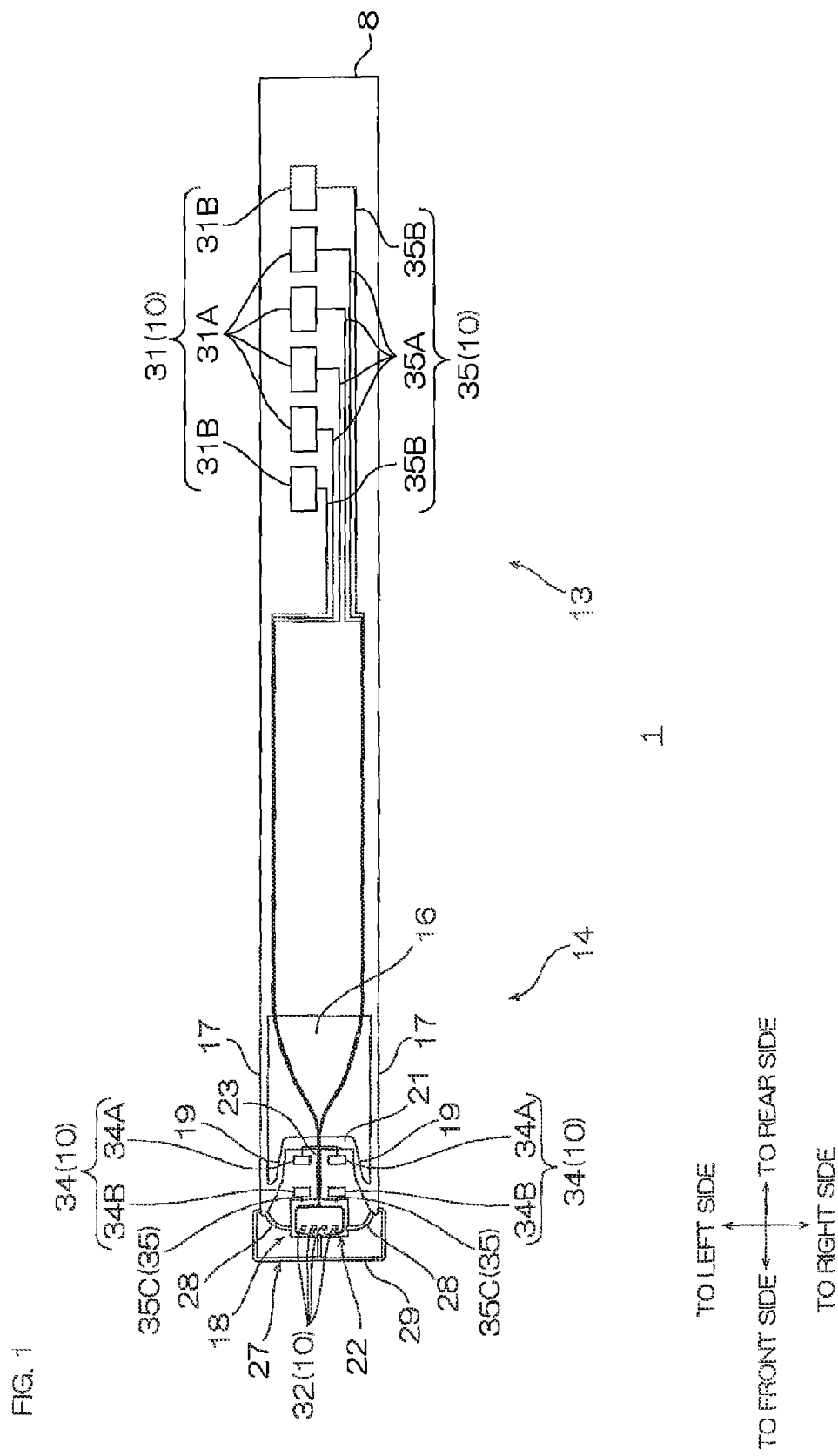
FIG. 1 shows a plan view of a suspension board with circuit in a first embodiment of the present invention.

In FIG. 1, a lateral direction on the surface of a paper sheet with FIG. 1 is a front-rear direction (a first direction). The left and right sides of the surface of the paper sheet with FIG. 1 are a front side (one side in the first direction) and a rear side (the other side in the first direction). A vertical direction on the surface of the paper sheet with FIG. 1 is a left-right direction (a widthwise direction or second direction). The upper and lower sides of the surface of the paper sheet with FIG. 1 are a left side (one side in the widthwise direction or second direction) and a right side (the other side in the widthwise direction or second direction). The direction of thickness of the paper sheet with FIG. 1 is an upper-lower direction (a thickness direction or third direction). The front and back sides in a depth direction perpendicular to the surface of the paper sheet with FIG. 1 are an upper side (one side in the thickness direction or third direction) and a lower side (the other side in the thickness direction or third direction). Specifically, the foregoing directions are based on the directional arrows in each of the drawings.

Figure 2:
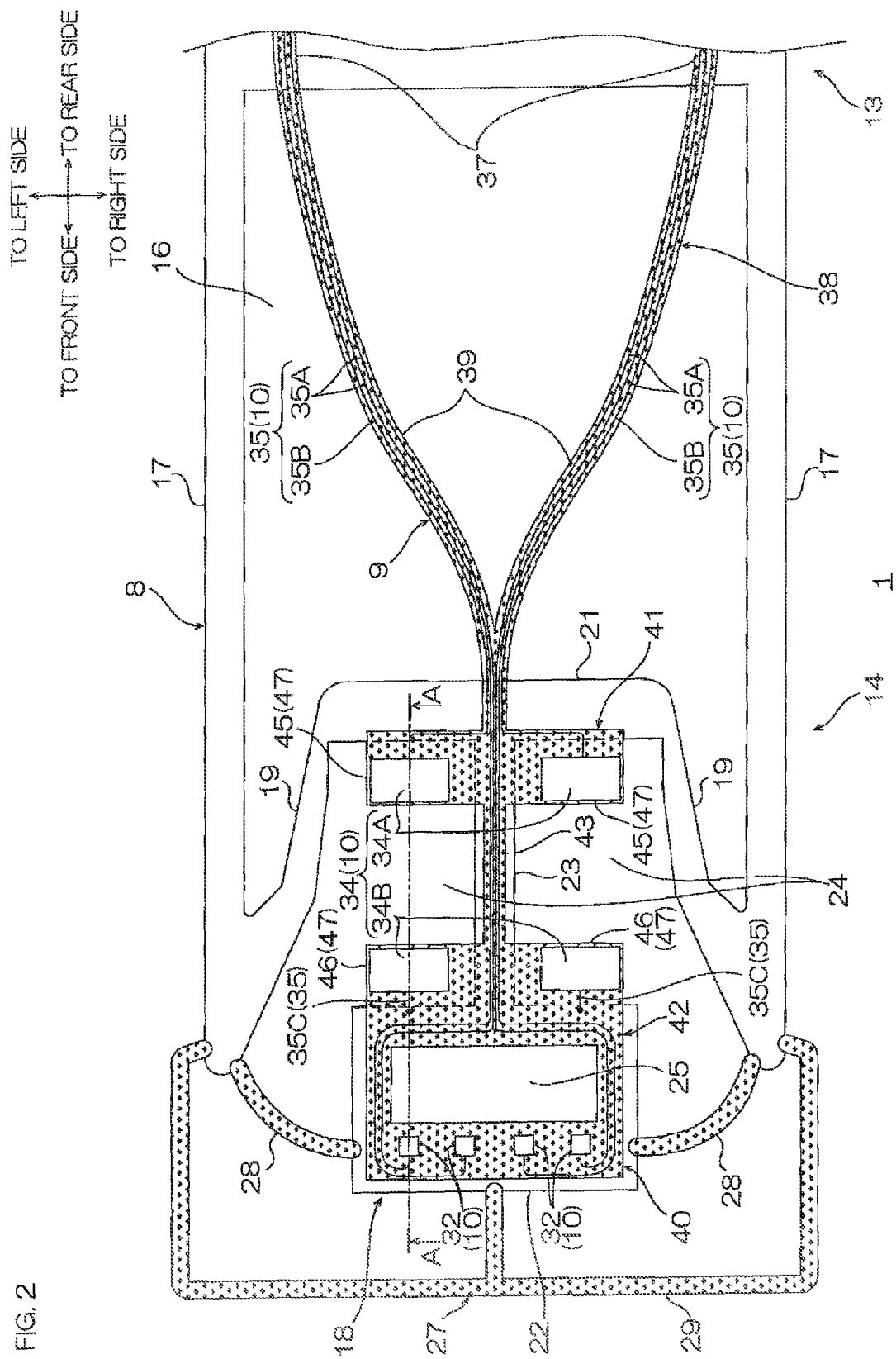
FIG. 2 shows a plan view of the gimbal portion of the suspension board with circuit shown in FIG. 1.
Figure 3:
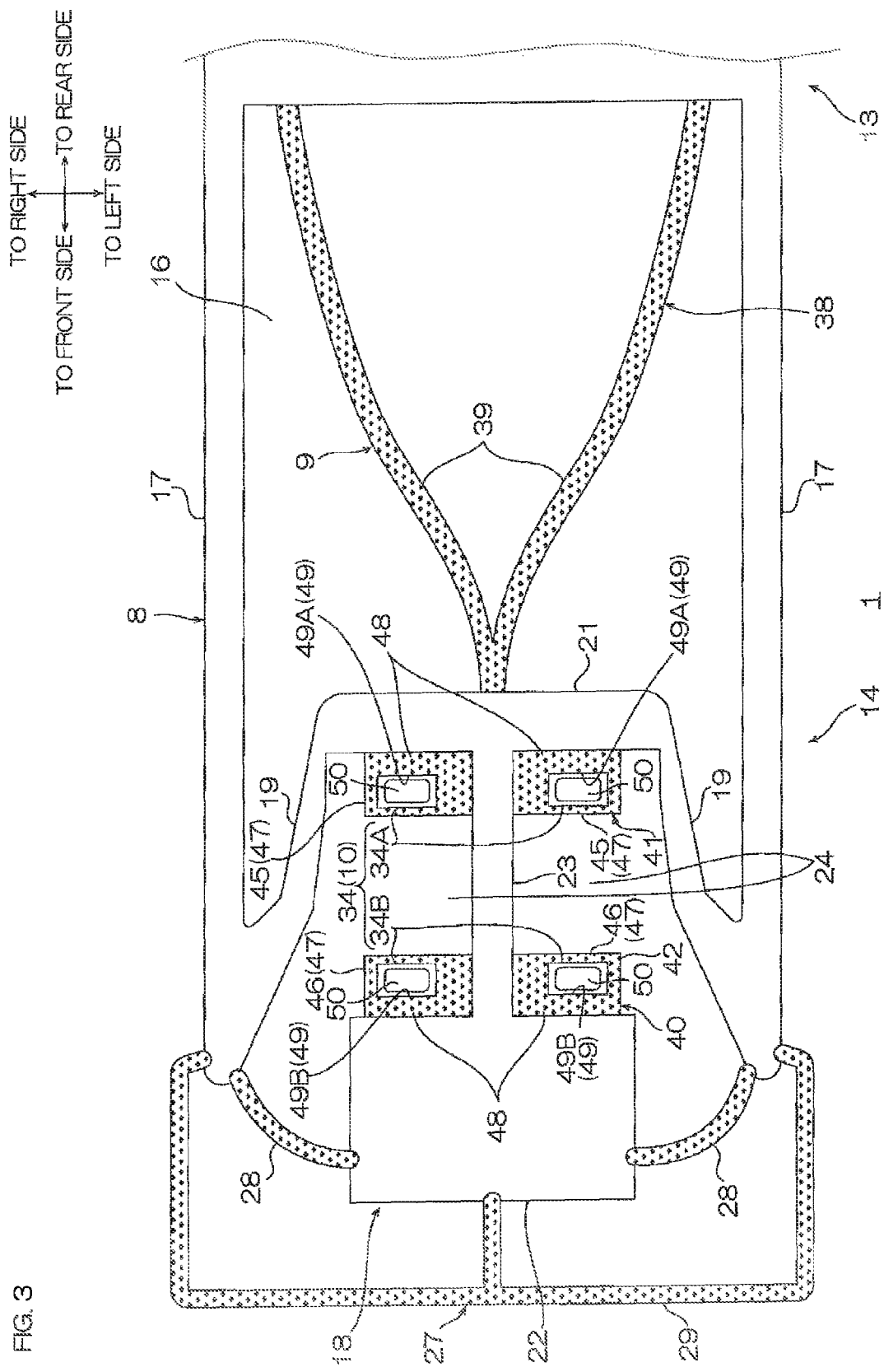
FIG. 3 shows a bottom view of the gimbal portion of the suspension board with circuit shown in FIG. 1.

Note that, in FIG. 1, an insulating base layer 9 and an insulating cover layer 11 are omitted. In FIGS. 2 and 3, the insulating base layer 9 is shown, while the insulating cover layer 11 is omitted.

First Embodiment

Figure 4:
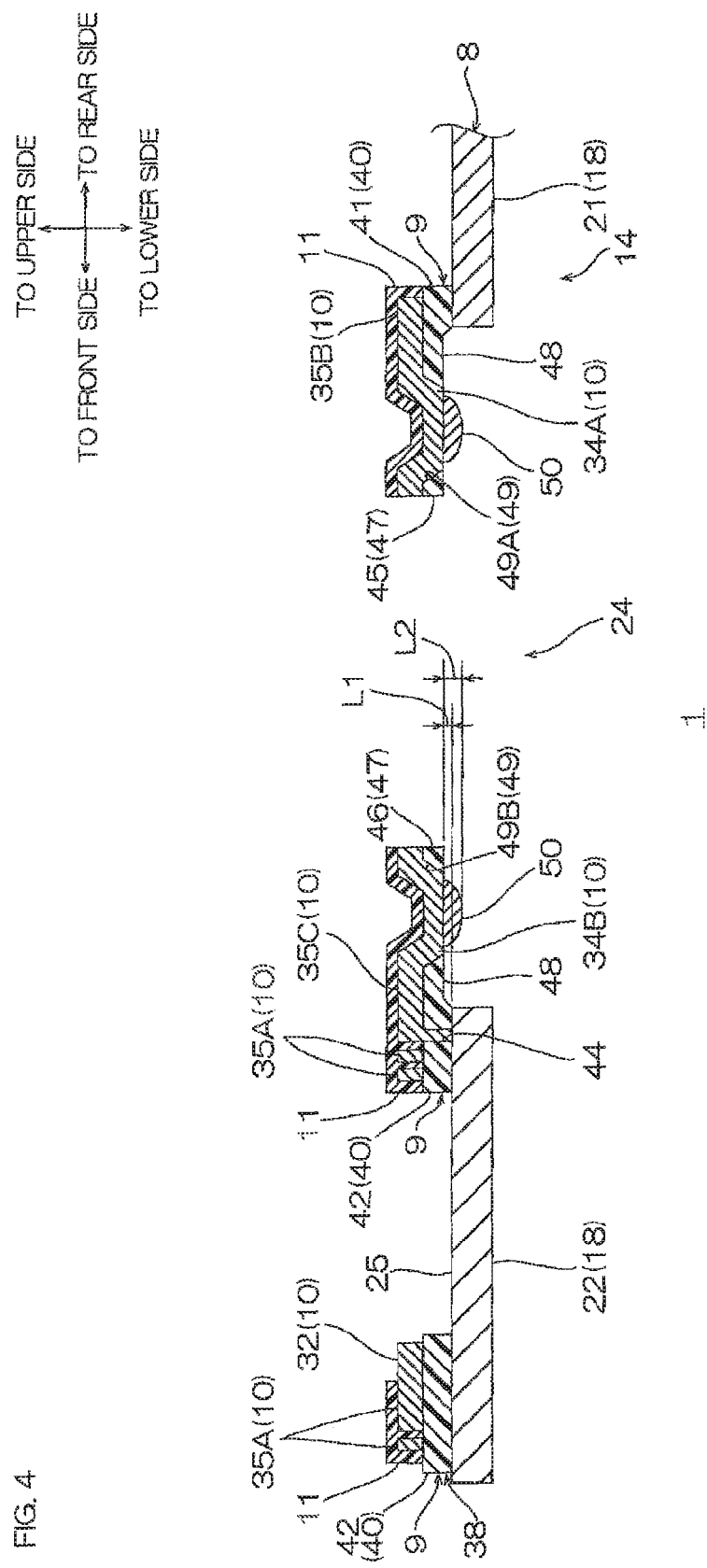
FIG. 4 shows a cross-sectional view of the gimbal portion along the line A-A shown in FIG. 2.

As shown in FIG. 7B, a suspension board with circuit 1 shown in FIGS. 1 and 4 is mounted in a hard disk drive (not shown). On the suspension board with circuit 1, a slider 4 on which a magnetic head 3 is mounted and piezo-elements 5 each as an example of an electronic element or a piezoelectric element have been mounted.

As shown in FIG. 1, the suspension board with circuit 1 is formed in a flat belt shape extending in the front-rear direction. In the suspension board with circuit 1, a conductive layer 10 is supported on a metal supporting board 8.

The metal supporting board 8 is formed in a flat belt shape extending in the front-rear direction and integrally includes a main body portion 13, and a gimbal portion 14 formed on the front side of the main body portion 13.

The main body portion 13 is formed in a generally rectangular shape in plan view extending in the front-rear direction. The main body portion 13 is supported on the load beam (not shown) of the hard disk drive when the suspension board with circuit 1 is mounted in the hard disk drive.

The gimbal portion 14 is formed to extend from the front end of the main body portion 13 to the front side. The gimbal portion 14 is formed with a board opening 16 extending through the gimbal portion 14 in the thickness direction and having a generally rectangular shape in plan view.

The gimbal portion 14 includes a pair of outrigger portions 17 defined widthwise outside the board opening 16, and a tongue portion 18 connected to the outrigger portions 17.

The pair of outrigger portions 17 are formed so as to linearly extend from the both widthwise end portions of the main body portion 13 to the front side.

As shown in FIGS. 2 and 3, the tongue portion 18 is provided widthwise inward of the pair of outrigger portions 17 and connected to the pair of outrigger portions 17 via a pair of first connecting portions 19 extending widthwise inward and obliquely rearward from the respective front end portions of the pair of outrigger portions 17.

The tongue portion 18 is formed in a generally H-shaped shape in plan view which is open toward both sides in the widthwise direction. That is, in the tongue portion 18, the both widthwise end portions of the middle portion in the front-rear direction have been cut away (opened).

Specifically, the tongue portion 18 integrally includes a base portion 21 having a generally rectangular shape in plan view extending long in the widthwise direction, a stage 22 located on the front side of the base portion 21 to be spaced apart therefrom and having a generally rectangular shape in plan view extending long in the widthwise direction, and a middle portion 23 connecting the respective widthwise middle portions of the base portion 21 and the stage 22 and having a generally rectangular shape in plan view extending in the front-rear direction.

In the cut-away portions of the tongue portion 18, a pair of communicating spaces 24 are defined.

The pair of communicating spaces 24 are defined on both widthwise sides of the middle portion 23. The pair of communicating spaces 24 are formed so as to extend through the meal supporting board 8 in the thickness direction.

The base portion 21 has both widthwise and portions which are connected to the widthwise inner end portions of the pair of first connecting portions 19.

At the middle of the stage 22 in each of the widthwise direction and the front-rear direction, as shown in FIG. 2, a mounting region 25 on which the slider 4 is mounted is defined.

As shown in FIGS. 2 and 3, the stage 22 is connected to the outrigger portions 17 by a second connecting portion 27 having flexibility.

The second connecting portion 27 includes a pair of curved portions 28 which curvedly connect the front ends of the pair of outrigger portions 17 and the both widthwise ends of the stage 22, and an E-shaped portion 29 which connects the front ends of the pair of outrigger portions 17 and the front end of the stage 22.

The curved portions 28 curvedly extend widthwise inward and obliquely frontward firm the front ends of the outrigger portions 17 to reach the both widthwise ends of the stage 22.

The E-shaped portion 29 has a generally E-shaped shape in plan view. Specifically, the longitudinal portions of the E-shaped portion 29 extend from the front ends of the both outrigger portions 17 toward the front side to subsequently bend widthwise inward. After extending widthwise inward, the portions of the E-shaped portion 29 extending from the front ends of the both outrigger portions 17 are united and bent rearward to reach the widthwise middle of the front end of the stage 22.

The middle portion 23 is formed narrow to be bendable in the widthwise direction.

As shown in FIG. 1, the conductive layer 10 includes external-side terminals 31, head-side terminals 32, piezo-terminals 34 (see FIG. 2) each as an example of a connection terminal, and wires 35.

The external-side terminals 31 are provided in the rear end portion of the main body portion 13. The plurality of (six) external-side terminals 31 are arranged to be spaced apart from each other in the front-rear direction. The external-side terminals 31 include signal terminals 31A, and power source terminals 31B.

The signal terminals 31A correspond to the middle four of the plurality of (six) external-side terminals 31 in the front-rear direction and are electrically connected to a read/write board (not shown).

The power source terminals 31B correspond to the front-side one and the rear-side one of the plurality of (six) external-side terminals 31 and are electrically connected to a power source (not shown).

As shown in FIGS. 1 and 2, the head-side terminals 32 are provided in the front end portion of the stage 22. The plurality of (four) head-side terminals 32 are arranged to be spaced apart from each other in the widthwise direction.

The plurality of (four) piezo-terminals 34 are arranged in the communicating spaces 24. Specifically, the piezo-terminals 34 include a pair of rear-side piezo-terminals 34A disposed in the communicating spaces 24 located on the front side of the front end edge of the base portion 21 to be widthwise spaced apart from each other on both sides of the middle portion 23, and a pair of front-side piezo-terminals 34B disposed in the communicating spaces 24 located on the front side of the rear-side piezo-terminals 34A and on the rear side of the rear end edge of the stage 22 to be widthwise spaced apart from each other on both widthwise sides of the middle portion 23.

As shown in FIG. 1, the plurality of (six) wires 35 are formed in the main body portion 13 to be widthwise spaced apart from each other. The wires 35 include signal wires 35A, and power source wires 35B.

The signal wires 35A correspond to the widthwise inner four of the plurality of (six) wires 35 and electrically connected to the signal terminals 31A and the head-side terminals 32. The signal wires 35A transmit electric signals between the magnetic head 3 (see FIG. 7B) and the read/write board (not shown).

Specifically, the signal wires 35A are formed to extend from the signal terminals 31A toward the front side in the rear end portion of the main body portion 13, bend in the middle of the main body portion 13 in the front-rear direction, while being divided into two branches, and extend toward the both widthwise end portions. Then, at the both widthwise end portions, the signal wires 35A are bent toward the front side to extend along the widthwise outer end edges toward the front end portion of the main body portion 13. In the gimbal portion 14, as shown in FIG. 2, the signal wires 35A are converged on the rear side of the base portion 21, while passing over a board opening 16, to extend frontward along the middle portion 23. Then, in the rear end portion of the stage 22, the signal wires 35A bend toward the both widthwise end portions, while being divided again into two branches, to extend toward the front side along the peripheral end edge of the stage 22. At the front end portion of the stage 22, the signal wires 35A are turned back to reach the head-side terminals 32.

As shown in FIG. 1, the power source wires 35B correspond to the two of the plurality of (six) wires 35 which are located on both widthwise outer sides of the signal wires 35A and electrically connected to the power source terminals 31B and the rear-side piezo-terminals 34A. The power source wires 35B transmit electric signals between the piezo-elements 5 (see FIG. 7B) and the power source (not shown).

Specifically, in the rear end portion of the main body portion 13, the power source wires 35B are formed to extend from the power source terminals 31B toward the front side along the signal wires 35A to reach the base portion 21. As shown in FIG. 2, in the base portion 21, the power source wires 35B bend toward the both widthwise end portions, while being divided into branches. Then, the power source wires 35B bend toward the front side to reach the rear-side piezo-terminals 34A.

The wires 35 also include a plurality of (two) ground wires 35C formed on the gimbal portion 14 to be widthwise spaced apart from each other.

The ground wires 35C are provided so as to ground the front-side piezo-terminals 34B.

Specifically, the ground wires 35C extend from the front-size piezo-terminals 34B toward the front side and bend downward (see FIG. 4) on the rear side of the signal wires 35A to come in contact with the metal supporting board 8.

As shown in FIG. 4, the suspension board with circuit 1 includes the metal supporting board 8, the insulating base layer 9 as an example of an insulating layer formed on the metal supporting board 8, the conductive layer 10 formed on the insulating base layer 9, and the insulating cover layer 11 formed on the insulating base layer 9 so as to cover the conductive layer 10.

As shown in FIG. 1, the metal supporting board 8 is formed in a shape corresponding to the outer shape of the suspension board with circuit 1.

The metal supporting board 8 is formed of a metal material such as, e.g., stainless steel, a 42-alloy, aluminum, a copper-beryllium alloy, or phosphor bronze. Preferably, the metal supporting board 8 is formed of stainless steel.

The thickness of the metal supporting board 8 is in a range of; e.g., not less than 5 μm, or preferably not less than 10 μm and, e.g., not more than 30 μm, or preferably not more than 25 μm.

As shown in FIGS. 1 to 2, the insulating base layer 9 is formed on the upper surface of the metal supporting board 8 into a pattern corresponding to the conductive layer 10 described above. Specifically, the insulating base layer 9 includes a main-body-portion insulating layer 37 corresponding to the main body portion 13, and a gimbal-portion insulating layer 38 corresponding to the gimbal portion 14.

The main-body-portion insulating layer 37 is formed in the main body portion 13 so as to correspond to the external-side terminals 31 and the wires 35.

As shown in FIG. 2, the gimbal-portion insulating layer 38 includes a board-opening insulating layer 39 corresponding to the board opening 16, and a tongue-portion insulating layer 40 corresponding to the tongue portion 18.

The board-opening insulating layer 39 is formed to correspond to the conductive layer 10 in the board opening 16. Specifically, the board-opening insulating layer 39 is formed in a generally Y-shaped shape in plan view in which the rear portion of the board-opening insulating layer 39 is divided into two branches located on both widthwise sides to extend correspondingly to the wires 35 extending through the board opening 16, and the two branches are united on the rear side of the base portion 21 to extend to a intermediate point in the front-rear direction of the base portion 21.

The tongue-portion insulating layer 40 is formed in a generally H-shaped shape in plan view to correspond to the tongue portion 18. The tongue-portion insulating layer 40 integrally includes a base-portion insulating layer 41 continued to the board-opening insulating layer 39 and having a generally rectangular shape in plan view extending long in the widthwise direction, a stage insulating layer 42 located on the front side of the base-portion insulating layer 41 to be spaced apart therefrom and having a generally rectangular shape in plan view extending long in the widthwise direction, and a middle-portion insulating layer 43 connecting the respective widthwise middle portions of the base-portion insulating layer 41 and the stage insulating layer 42 and having a generally rectangular shape in plan view extending long in the front-rear direction.

The base-portion insulating layer 41 is formed to correspond to the conductive layer 10 in the base portion 21 of the tongue portion 18. The base-portion insulating layer 41 is continued from the board-opening insulating layer 39 to extend outwardly on both widthwise sides on the front side of the base portion 21 of the tongue portion 18. The base-portion insulating layer 41 is also formed to extend to the position frontward of the front end edge of the base portion 21. In the base-portion insulating layer 41, as shown in FIG. 3, the portions exposed from the communicating spaces 24 on both widthwise sides of the middle portion 23 are defined as a pair of rear-side-piezo-terminal formation portions 45.

As shown in FIG. 2, the stage insulating layer 42 is formed to correspond to the conductive layer 10 in the stage 22 of the tongue portion 18. The stage insulating layer 42 is formed to extend from the front side of the stage 22 of the tongue portion 18 to the position rearward of the rear end edge of the stage 22. In the stage insulating layer 42, as shown in FIG. 3, the portions exposed from the communicating spaces 24 on both widthwise sides of the middle portion 23 are defined as a pair of front-side-piezo-terminal formation portions 46. In the stage insulating layer 42, a generally rectangular opening corresponding to the mounting region 25 is formed. In the stage insulating layer 42, a plurality of (two) ground openings 44 are further formed.

As shown in FIG. 4, the ground openings 44 are formed to extend through the stage insulating layer 42 in the thickness direction at the portions thereof overlapping the rear end portion of the stage 22 when projected in the thickness direction.

The width and length (length in the front-rear direction) of each of the ground openings 44 are in a range of; e.g., not less than 5 μm, or preferably not less than 15 μm and, e.g., not more than 200 μm, or preferably not more than 150 μm.

As shown in FIG. 2, the middle-portion insulating layer 43 corresponds to the conductive layer 10 in the middle portion 23 of the tongue portion 18 and is formed to be narrower than the middle portion 23.

It is assumed that the pair of rear-side-piezo-terminal formation portions 45 and the pair of front-side-piezo-terminal formation portions 46 are collectively referred to as piezo-terminal formation portions 47.

As shown in FIGS. 3 and 4, the piezo-terminal formation portions 47 include recessed portions 48, and terminal openings 49 each as an example of an opening.

The four recessed portions 48 are provided in the pair of rear-side-piezo-terminal formation portions 45 and the pair of front-side-piezo-terminal formation portions 46, respectively. As shown in FIG. 4, the recessed portions 48 are formed to be recessed upward from the end edges of the metal supporting board 8 which face the communicating spaces 24 toward a position above the upper surface of the metal supporting board 8.

The ratio of the depth L1 (height in the upper-lower direction) of each of the recessed portions 48 from the upper surface of the metal supporting board 8 to the thickness of the insulating base layer 9 is in a range of, e.g., not less than 0.1%, or preferably not less than 5% and, e.g., not more than 90%, or preferably not more than 60%. Specifically, the depth L1 (height in the upper-lower direction) of the recessed portion 48 from the upper surface of the metal supporting board 8 is in a range of, e.g., not less than 0.01 μm, or preferably not less than 0.5 μm and, e.g., not more than 9 μm, or preferably not more than 6 μm.

As shown in FIG. 3, the terminal openings 49 are formed respectively in each of the rear-side-piezo-terminal formation portions 45 of the base-portion insulating layer 41 and each of the front-side-piezo-terminal formation portions 46 of the stage insulating layer 42 in one-tone correspondence. Specifically, as shown in FIG. 4, the terminal openings 49 are each formed in a generally rectangular shape to extend through the rear-side-piezo-terminal formation portions 45 of the base-portion insulating layer 41 and the front-side-piezo-terminal formation portions 46 of the stage insulating layer 42 in the thickness direction.

The width and length (length in the front-rear direction) of each of the terminal openings 49 are in a range of e.g., not less than 10 μm, or preferably not less than 20 μm and, e.g., not more than 150 μm, or preferably not more than 100 μm.

As shown in FIG. 2, the insulating base layer 9 is formed also in a pattern formed with the second connecting portion 27.

The insulating base layer 9 is formed of an insulating material such as a synthetic resin such as, e.g., a polyimide resin, a polyamide imide resin, an acrylic resin, a polyether nitrile resin, a polyether sulfone resin, a polyethylene terephthalate resin, a polyethylene naphthalate resin, or a polyvinyl chloride resin. Preferably, the insulating base layer 9 is formed of a polyimide resin.

The thickness (maximum thickness) of the insulating base layer 9 is in a range of, e.g., not less than 1 μm, or preferably not less than 3 μm and, e.g., not more than 35 μm, or preferably not more than 33 μm.

As described above, the conductive layer 10 is formed in a pattern including the external-side terminals 31 (FIG. 1), the head-side terminals 32, the piezo-terminals 34, and the wires 35.

Note that, as shown in FIG. 4, the piezo-terminals 34 are formed so as to be recessed downward into the terminal openings 49 of the insulating base layer 9. As a result, the lower surfaces of the piezo-terminals 34 are exposed downward from the insulating base layer 9. The lower surfaces of the piezo-terminals 34 are formed flush with the lower surface of the insulating base layer 9 formed around the peripheral edge portions thereof in the widthwise direction and in the front-rear direction, i.e., in a planar direction.

The front end portions of the ground wires 35C are embedded downward in the ground openings 44. As a result, the end portions of the ground wires 35C opposite to the end portions thereof connected to the front-side piezo-terminals 34B are in contact with the upper surface of the metal supporting board 8.

The conductive layer 10 is formed of a conductive material such as, e.g., copper, nickel, gold, a solder, or an alloy thereof. Preferably, the conductive layer 10 is formed of copper.

The thickness of the conductive layer 10 is in a range of e.g., not less than 3 μm, or preferably not less than 5 μm and, e.g., not more than 50 μm, or preferably not more than 20 μm.

The width of each of the wires 35 is in a range of; e.g. not less than 5 μm, or preferably not less than 8 μm and, e.g., not more than 200 μm, or preferably not more than 100 μm.

The spacing between the plurality of wires 35 is in a range of, e.g., not less than 5 μm, or preferably not less than 8 μm and, e.g., not more than 1000 μm, or preferably not more than 100 μm.

The width and length (length in the front-rear direction) of each of the external-side terminals 31 and the head-side terminals 32 are in a range of e.g., not less than 20 μm, or preferably not less than 30 μm and, e.g., not more than 1000 μm, or preferably not more than 800 μm.

The spacing between the plurality of external-side terminals 31 and the spacing between the plurality of head-side terminals 32 are in a range of e.g., not less than 20 μm, or preferably not less than 30 μm and, e.g., not more than 1000 μm, or preferably not more than 800 μm.

The width and length (length in the front-rear direction) of each of the piezo-terminals 34 are the same as those of each of the terminal openings 49 and in a range of e.g., not less than 10 μm, or preferably not less than 20 μm and, e.g., not more than 150 μm, or preferably not more than 100 μm.

Note that the ratios of the width and length (length in the front-rear direction) of each of the piezo-terminals 34 to those of each of the head-side terminals 32 are in a range of e.g., not less than 12%, or preferably not less than 15% and, e.g., not more than 66%, or preferably not more than 50%.

On the surface of each of the plurality of terminals, specifically the external-side terminals 31, the head-side terminals 32, and the piezo-terminals 34, a plating layer is formed by plating such as, e.g., electroless plating or electrolytic plating. Preferably, the plating layer is formed by electrolytic plating. The plating layer is formed of a metal material such as, e.g., nickel or gold. Preferably, the plating layer is formed of gold. The thickness of the plating layer is in a range of, e.g., not less than 0.1 μm, or preferably not less than 1 μm and, e.g., not more than 8 μm, or preferably not more than 4 μm.

As shown in FIG. 1, the insulating cover layer 11 is formed over the main body portion 13 and the gimbal portion 14. As shown in FIG. 4, the insulating cover layer 11 is formed on the insulating base layer 9 into a pattern including the conductive layer 10 in plan view.

Specifically, the insulating cover layer 11 is formed in the pattern covering the respective upper surfaces of the wires 35 and the piezo-terminals 34 and exposing the respective upper surfaces of the external-side terminals 31 (see FIG. 1) and the head-side terminals 32.

The insulating cover layer 11 is formed of the same insulating material as the insulating material forming the insulating base layer 9. The thickness of the insulating cover layer 11 is in a range of; e.g., not less than 1 μm, or preferably not less than 3 μm and, e.g., not more than 40 μm, or preferably not more than 10 μm.

As shown in FIGS. 3 and 4, the suspension board with circuit 1 further includes protective layers 50.

The protective layers 50 are formed on the lower surfaces of the piezo-terminals 34 exposed from the terminal openings 49 when viewed from below to protect the piezo-terminals 34. Each of the protective layers 50 is formed of a conductive material such as, e.g., a low-melting-point solder or a conductive adhesive. Preferably, the protective layer 50 is formed of the low-melting-point solder. Examples of the low-melting-point solder include a solder made of a tin-silver-copper alloy, a solder made of a tin-silver-bismuth-indium alloy, a solder made of a tin-zinc alloy, a solder made of a tin-bismuth alloy, and a solder made of a tin-bismuth-silver alloy. Preferably, the low-melting-point solder has a melting point of not more than 220° C. Examples of the conductive adhesive include a silver paste.

The thickness L2 of each of the protective layers 50 is in a range of e.g., not less than 0.1 μm, or preferably not less than 1 μm and, e.g., not more than 50 μm, or preferably not more than 20 μm. Preferably, the thickness L2 of the protective layer 50 is larger than the depth L1 (height in the upper-lower direction) of each of the recessed portions 48 from the upper surface of the metal supporting board 8. That is, the lower end portion of the protective layer 50 is located below the upper surface of the metal supporting board 8.

The ratios of the width and length (length in the front-rear direction) of each of the protective layers 50 to the width and length (length in the front-rear direction) of each of the piezo-terminals 34 are in a range of, e.g., not less than 10%, or preferably not less than 20% and, e.g., not more than 120%, or preferably not more than 100%. Preferably, the width and length of the protective layer 50 are the same as or smaller than the width and length (length in the front-rear direction) of the piezo-terminal 34. Specifically, the width and length (length in the front-rear direction) of the protective layer 50 are in a range of, e.g., not less than 1 μm, or preferably not less than 4 μm and, e.g., not more than 180 μm, or preferably not more than 100 μm.

Next, a method of producing the suspension board with circuit 1 is described with reference to FIGS. 5A to 6G.

In the method, as shown in FIG. 5A, the metal supporting board 8 is prepared first.

Next, as shown in FIG. 5B, the insulating base layer 9 is formed on the metal supporting board 8.

Specifically, the insulating base layer 9 is formed on the metal supporting board 8 into a pattern corresponding to the main-body-portion insulating layer 37 and the gimbal-portion insulating layer 38. The insulating base layer 9 is formed in the pattern including depressed portions 55 in the portions of the gimbal-portion insulating layer 38 corresponding to the terminal openings 49 of the piezo-terminal formation portions 47 and including the ground openings 44 in the stage insulating layer 42.

The depressed portions 55 are formed so as to be recessed downward from the upper surface of the insulating base layer 9.

The ratio of the depth (height in the upper-lower direction) of each of the depressed portions 55 from the upper surface of the insulating base layer 9 to the thickness of the insulating base layer 9 is in a range of e.g., not less than 1%, or preferably not less than 5% and, e.g., not more than 80%, or preferably not more than 60%. Specifically, the depth (height in the upper-lower direction) of the depressed portion 55 from the upper surface of the insulating base layer 9 is in a range of, e.g., not less than 0.1 μm, or preferably not less than 0.5 μm and, e.g., not more than 8 μm, or preferably not more than 6 μm.

The width and length (length in the front-rear direction) of each of the depressed portions 55 are the same as the width and length (length in the front-rear direction) of each of the terminal openings 49.

To form the insulating base layer 9 in which the depressed portions 55 and the ground openings 44 are formed, a varnish of a photosensitive insulating material is applied onto the metal supporting board 8 and dried to form a base coating.

Then, the base coating is exposed to light via a gradation exposure photomask not shown (gradation exposure). The gradation exposure photomask includes light shielding portions, light semi-transmitting portions, and a light full transmitting portion in a pattern. The light full transmitting portion is caused to face the portion of the base coating in which the insulating base layer 9 is formed (except for the portions thereof in which the depressed portions 55 and the ground openings 44 are formed). The light semi-transmitting portions are caused to face the portions of the base coating in which the depressed portion 55 are formed. The light shielding portions are caused to face the portions of the base coating in which the insulating base layer 9 is not formed and the ground openings 44 are formed.

Thereafter, the base coating is developed and cured by heating as necessary to form the insulating base layer 9 including the depressed portions 55, and the ground openings 44 in the pattern described above.

Next, as shown in FIG. 5C, the conductive layer 10 is formed on the upper surface of the insulating base layer 9 by a pattern formation method such as an additive method or a subtractive method. Preferably, the conductive layer 10 is formed by the additive method.

That is, as shown in FIG. 1, the conductive layer 10 is formed on the upper surface of the insulating base layer 9 so as to include the external-side terminals 31, the head-side terminals 32, the piezo-terminals 34, and the wires 35. Note that the piezo-terminals 34 are formed so as to be recessed downward and fill the depressed portions 55. The end portions of the ground wires 35C opposite to the end portions thereof connected to the front-side piezo-terminals 34B are formed so as to be recessed downward in the ground openings 44.

Next, as shown in FIG. 5D, the insulating cover layer 11 is formed on the upper surface of the insulating base layer 9. To form the insulating cover layer 11, a varnish of a photosensitive insulating material is applied and dried to form a cover coating. Then, the cover coating is exposed to light, developed, and cured by heating to form the insulating cover layer 11 in the pattern described above.

Next, as shown in FIG. 6E, the metal supporting board 8 is trimmed by, e.g., etching or the like such that the board opening 16 is formed therein and the respective lower surfaces of the rear-side-piezo-terminal formation portions 45 of the base-portion insulating layer 41 of the insulating base layer 9 and the front-side-piezo-terminal formation portions 46 of the stage insulating layer 42 of the insulating base layer 9 are exposed.

Next, as shown in FIG. 6F, in the insulating base layer 9, the rear-side-piezo-terminal formation portions 45 of the base-portion insulating layer 41 and the front-side-piezo-terminal formation portions 46 of the stage insulating layer 42, which are exposed from the board opening 16, are partially removed. Specifically, the rear-side-piezo-terminal formation portions 45 and the front-side-piezo-terminal formation portions 46 are partially removed by etching, or preferably by wet etching or the like.

Thus, the recessed portions 48 are formed and the lower surfaces of the piezo-terminals 34 are exposed.

In addition, in the rear-side-piezo-terminal formation portions 45 of the base-portion insulating layer 41 and the front-side-piezo-terminal formation portions 46 of the stage insulating layer 42, the lower surfaces of the depressed portions 55 are removed, and consequently the terminal openings 49 are formed.

Next, as shown in FIG. 6G, on the lower surfaces of the piezo-terminals 34 exposed from the terminal openings 49, the protective layers 50 are formed. Specifically, the conductive material shown above is printed using a known printer or applied using a dispenser to form the protective layers 50 and protect the piezo-terminals 34.

In this manner, the suspension board with circuit 1 is obtained. The suspension board with circuit 1 is then shipped and stored until the slider 4 and the piezo-elements 5 are mounted thereon.

To mount the suspension board with circuit 1 in a hard disk drive, on the suspension board with circuit 1, the slider 4 and the piezo-elements 5 are mounted, as shown in FIGS. 7A and 7B. The steps of assembling the slider 4 and the piezo-elements 5 to the suspension board with circuit 1 are described with reference to FIGS. 7A and 7B.

The slider 4 is formed in a generally rectangular box shape in plan view.

Then, as shown in FIG. 7A, the slider 4 is mounted on the mounting region 25 via an adhesive layer 51. The front end edge of the slider 4 is formed along the head-side terminals 32. Specifically, the front end edge of the slider 4 is formed on the rear side of the head-side terminals 32 with a minute space interposed therebetween.

Then, between the head-side terminals 32 and the magnetic head 3, solder balls 52 are disposed.

Each of the piezo-elements 5 is an actuator expandable/contractible in the front-rear direction and formed in a generally rectangular shape in plan view extending in the front-rear direction. To each of the piezo-elements 5, electricity is supplied and the voltage thereof is controlled to expand/contract the piezo-element 5.

As shown in FIG. 8, the pair of piezo-elements 5 are disposed to be spaced apart from each other in the widthwise direction. At this time, as shown in FIG. 7A, the piezo-elements 5 are disposed to extend under and between the rear-side piezo-terminals 34A and the front-side piezo-terminals 34B such that the terminals of the piezo-elements 5 come in contact with the piezo-terminals 34A from below.

The piezo-elements 5 have the terminals thereof in contact with the lower end portions of the protective layers 50. The piezo-elements 5 are disposed such that the upper surfaces thereof are located below the upper surface of the metal supporting board 8.

Next, the suspension board with circuit 1 on which the slider 4 and the piezo-elements 5 are placed is subjected to a reflow process. Specifically, as shown in FIG. 7B, the suspension board with circuit 1 on which the slider 4 and the piezo-elements 5 are placed is heated in a reflow furnace to 100 to 250° C. at which the protective layers 50 and solder balls 52 melt.

Thus, the solder balls 52 are melted to electrically connect the head-side terminals 32 and the terminals of the magnetic head 3.

On the other hand, the protective layers 50 melt to spread over the entire lower surfaces of the piezo-terminals 34 exposed from the terminal openings 49 and bond the piezo-terminals 34 to the terminals of the piezo-elements 5.

Thus, the piezo-elements 5 are mounted on the suspension board with circuit 1. That is, the terminals on the rear end portions of the piezo-elements 5 and the terminals on the front end portions thereof are electrically coupled to the rear-side piezo-terminals 34A and the front-side piezo-terminals 34B via the protective layers 50 and fixed thereto.

Next, a swing of the slider 4 resulting from the expansion/contraction of the piezo-elements 5 is described with reference to FIG. 8.

First, to one of the piezo-elements 5, electricity is supplied via the rear-side piezo-terminal 34A, while the front-side piezo-terminal 34B is grounded to the metal supporting board 8, and the voltage thereof is controlled to contract the piezo-element 5. As a result, the rear-side piezo-terminal 34A and the front-side piezo-terminal 34B each fixing the one of the piezo-elements 5 relatively move closer to each other. That is, one of the front-side piezo-terminals 34B supported on the stage insulating layer 42 moves rearward toward the corresponding one of the rear-side piezo terminals 34A supported on the base-portion insulating layer 41.

At the same time, electricity is supplied to the other piezo-element 5 via the piezo-terminal 34 and the voltage of the electricity is controlled to expand the other piezo-element 5. As a result, the other rear-side piezo-terminal 34A and the other front-side piezo-terminal 34B each fixing the other piezo-element 5 relatively move away from each other. That is, the other front-side piezo-terminal 34B supported on the stage insulating layer 42 moves frontward away from the other rear-side piezo-terminal 34A supported on the base-portion insulating layer 41.

Consequently, the front end of the middle portion 23 and an intermediate portion thereof in the front-rear direction curve to one side in the widthwise direction (to the left side in FIG. 8), while the stage 22 swings to one side in the widthwise direction around the rear end of the middle portion 23 serving as a pivot point. Meanwhile, the slider 4 swings to one side in the widthwise direction.

Note that, when one of the piezo-elements 5 is expanded and the other piezo-element 5 is contracted, the slider 4 swings in the direction opposite to the direction mentioned above (to the other side in the widthwise direction or to the right side in FIG. 8).

By such expansion/contraction of the individual piezo-elements 5, the position of the magnetic head 3 and the angle thereof are accurately adjusted. At this time, by the expansion/contraction of each of the piezo-elements 5, the piezo-terminals 34 connected to the terminals thereof are slightly displaced.

In the suspension board with circuit 1, as shown in FIGS. 3 and 4, the piezo-terminals 34 are exposed from the terminal openings 49, but are protected by the protective layers 50. This can suppress the deposition of a foreign material on the piezo-terminals 34 and the corrosion of the piezo-terminals 34 during the period after the production of the suspension board with circuit 1 before the connection thereof to the piezo-elements 5

As a result, it is possible to maintain the quality of the piezo-terminals 34 and improve the reliability of the connection thereof to the piezo-elements 5.

In the suspension board with circuit 1, as shown in FIG. 8, as a result of driving the piezo-elements 5, the piezo-terminals 34 are displaced according to the driven piezo-elements 5. Accordingly, the piezo-terminals 34 are required to have connection reliability higher than that required of connection terminals which are not displaced. However, since the piezo-terminals 34 are protected by the protective layers 50, the piezo-terminals 34 can reliably be connected to the piezo-elements 5.

In the suspension board with circuit 1, as shown in FIGS. 7A and 7B, the piezo-terminals 34 can be electrically connected to the piezo-elements 5 via the protective layers 50 having conductivity.

Therefore, using the protective layers 50, the piezo-elements 5 can be mounted on the suspension board with circuit 1.

On the suspension board with circuit 1, as shown in FIGS. 7A and 7B, the piezo-elements 5 can be mounted by a simple and easy method which brings the terminals of the piezo-elements 5 into contact with the protective layers 50 each made of a solder and causes the protective layers 50 to reflow.

As a result, it is possible to simplify the step for mounting the piezo-elements 5 on the suspension board with circuit 1 and reduce cost.

In the suspension board with circuit 1, as shown in FIGS. 3 and 4, it is possible to protect the lower surfaces of the piezo-terminals 34 exposed from the terminal openings 49 and suppress the deposition of a foreign material on the piezo-terminals 34 and the corrosion of the piezo-terminals 34 during the period after the production of the suspension board with circuit 1 before the connection thereof to the piezo-elements 5.

In the a suspension board with circuit 1, as shown in FIG. 4, the recessed portions 48 are formed. As a result, the lower surfaces of the piezo-terminals 34 are located above the upper surface of the metal supporting board 8. This can inhibit an external member from coming into contact with the piezo-terminals 34.

Since the protective layers 50 are made of a conductive material, as shown in FIG. 7B, it is possible to bring the piezo-elements 5 into contact with the protective layers 50 and easily and electrically connect the piezo-terminals 34 to the piezo-elements 5 via the protective layers 50.

In addition, by adjusting the thickness L2 of each of the protective layers 50, it is possible to adjust the position of each of the piezo-elements 5 in the upper-lower direction.

This allows each of the piezo-elements 5 to be mounted at any position on the suspension board with circuit 1.

In the suspension board with circuit 1, the protective layers 50 located in the recessed portions 48 are formed large such that the lower end portions thereof are located below the upper surface of the metal supporting board 8. This allows the protective layer 50 to more reliably protect the piezo-terminals 34.

In the method of producing the suspension board with circuit 1, as shown in FIGS. 6B and 6F, the piezo-terminals 34 fill the depressed portions 55 of the insulating base layer 9, while the lower side of the insulating base layer 9 is partially removed. This allows simultaneous formation of the terminal openings 49 and the recessed portions 48.

In addition, since the recessed portions 48 are formed, the piezo-terminals 34 are located above the upper surface of the metal supporting board 8. This can inhibit an external member from coming into contact with the piezo-terminals 34.

Since the protective layers 50 are made of a conductive material, as shown in FIGS. 7A and 7B, it is possible to bring the piezo-elements 5 into contact with the protective layers 50 and easily and electrically connect the piezo-terminals 34 to the piezo-elements 5 via the protective layers 50.

In addition, by adjusting the thickness L2 of each of the protective layers 50, it is possible to adjust the position of each of the piezo-elements 5 in the upper-lower direction.

This allows each of the piezo-elements 5 to be mounted at any position on the suspension board with circuit 1.

Second Embodiment

Referring to FIG. 9, the suspension board with circuit 1 in a second embodiment is described. Note that, in the second embodiment, the same members as in the first embodiment described above are designated by the same reference numerals and a detailed description thereof is omitted.

In the first embodiment described above, as shown in FIG. 4, the recessed portions 48 are formed in the insulating base layer 9. As a result, the lower surfaces of the depressed portions 55 are removed, and consequently the terminal openings 49 are formed. By contrast, in the second embodiment, the recessed portions 48 are not formed in the insulating base layer 48. As a result, the terminal openings 49 extending through the insulating base layer 9 in the thickness direction are not formed so that the depressed portions 55 formed in the production process are left.

Note that the piezo-terminals 34 of the conductive layer 10 are formed to be recessed downward and fill the depressed portions 55. Consequently, the upper surfaces of the piezo-terminals 34 are located below the upper surfaces of the wires 35.

In the insulating cover layer 11, terminal openings 56 each as an example of the opening are formed.

The terminal openings 56 are formed so as to overlap the depressed portions 55 when projected in the thickness direction and extend through the insulating cover layer 11 in the thickness direction.

The protective layers 50 are formed on the upper surfaces of the piezo-terminals 34 exposed from the terminal openings 56 when viewed from above to protect the piezo-terminals 34. The upper end portions of the protective layers 50 are located above the upper surface of the insulating cover layer 11.

To obtain the suspension board with circuit 1 described above, in the same manner as in the first embodiment described above, the metal supporting board 8 is prepared, the insulating base layer 9 is formed over the metal supporting board 8, and the conductive layer 10 is formed on the upper surface of the insulating base layer 9.

Then, the insulating cover layer 11 is formed in a pattern having the terminal openings 56 so as to expose the upper surfaces of the piezo-terminals 34.

On the surface of each of the plurality of terminals, specifically the external-side terminals 31, the head-side terminals 32, and the piezo-terminals 34, a plating layer is formed by plating such as, e.g., electroless plating or electrolytic plating. Preferably, the plating layer is formed by electrolytic plating.

Next, the metal supporting board 8 is trimmed so as to leave the portions thereof which overlap the terminal openings 56 when projected in the thickness direction.

Then, the protective layers 50 are formed on the upper surfaces of the piezo-terminals 34 exposed from the terminal openings 56 such that the upper end portions of the protective layers 50 are located above the upper surface of the insulating cover layer 11.

In this manner, the suspension board with circuit 1 in the second embodiment is obtained.

The suspension board with circuit 1 thus obtained is then shipped and stored until the slider 4 and the piezo-elements 5 are mounted thereon.

To mount the suspension board with circuit 1 in a hard disk drive, in the suspension board with circuit 1, the slider 4 is mounted on the mounting region 25. In the suspension board with circuit 1, the piezo-elements 5 are also mounted on the piezo-terminals 34 from above to be electrically connected thereto via the protective layers 50.

To assemble the slider 4 and the piezo-elements 5 to the suspension board with circuit 1, in the same manner as in the first embodiment described above, the slider 4 is placed via the adhesive layer 51, and the solder balls 52 are disposed.

In addition, the piezo-elements 5 are disposed on the protective layers 50 from above such that the terminals of the piezo-elements 5 come into contact with the protective layers 50.

Then, the suspension board with circuit 1 in which the slider 4 and the piezo-elements 5 are disposed is subjected to a reflow process to electrically connect the head-side terminals 32 and the terminals of the magnetic head 3 and electrically connect the piezo-terminals 34 and the terminals of the piezo-elements 5.

In the suspension board with circuit 1 in the second embodiment, as shown in FIG. 9, the piezo-terminals 34 fill the depressed portions 55 of the insulating base layer 9 and consequently recessed downward to be located below the wires 35.

This can inhibit an external member from coming into contact with the piezo-terminals 34.

In addition, the protective layers 50 are allowed to protect, from above the terminal openings 56, the piezo-terminals 34 exposed from the terminal openings 56 and suppress the deposition of a foreign material on the piezo-terminals 34 and the corrosion of the piezo-terminals 34 during the period after the production of the suspension board with circuit 1 before the connection thereof to the piezo-elements 5.

Also, in the suspension board with circuit 1 in the second embodiment, as shown in FIG. 9, the protective layers 50 disposed in the terminal openings 56 are formed large such that the upper end portions thereof are located above the upper surface of the insulating cover layer 11. This allows the protective layers 50 to more reliably protect the piezo-terminals 34.

In the method of producing the suspension board with circuit 1 in the second embodiment, as shown in FIG. 9, the piezo-terminals 34 fill the depressed portions 55 of the insulating base layer 9. Consequently, the piezo-terminals 34 are formed so as to be recessed downward from the wires 35.

As a result, even when the terminal openings 56 which expose the piezo-terminals 34 are formed in the insulating cover layer 11, since the piezo-terminals 34 are located so as to be recessed downward from the wires 35, it is possible to inhibit an external member from coming into contact with the piezo-terminals 34.

Since the protective layers 50 are made of a conductive material, it is possible to bring the piezo-elements 5 into contact with the protective layers 50 and easily electrically connect the piezo-terminals 34 to the piezo-elements 5 via the protective layers 50.

In addition, by adjusting the thicknesses of the protective layers 50, it is possible to adjust the positions of the piezo-elements 5 in the upper-lower direction.

This allows the piezo-elements 5 to be mounted at any positions on the suspension board with circuit 1.

Third Embodiment

Referring to FIG. 10, the suspension board with circuit 1 in a third embodiment is described. Note that, in the third embodiment, the same members as in the second embodiment described above are designated by the same reference numerals and a detailed description thereof is omitted.

In the second embodiment described above, as shown in FIG. 9, the depressed portions 55 are formed in the insulating base layer 9. By contrast, in the third embodiment, as shown in FIG. 10, the insulating base layer 9 does not include the depressed portions 55.

The protective layers 50 are formed on the upper surfaces of the piezo-terminals 34 exposed from the terminal openings 56 when viewed from above to protect the piezo-terminals 34.

To obtain the suspension board with circuit 1, in the same manner as in the second embodiment described above, the metal supporting board 8 is prepared, the insulating base layer 9 not including the depressed portions 55 is formed on the metal supporting board 8, and the conductive layer 10 is formed on the upper surface of the insulating base layer 9.

Then, the insulating cover layer 11 is formed in a pattern having the terminal openings 56 so as to expose the upper surfaces of the piezo-terminals 34.

Then, the meal supporting board 8 is trimmed so as to leave the portions thereof which overlap the terminal openings 56 when projected in the thickness direction.

Then, on the upper surfaces of the piezo-terminals 34 exposed from the terminal openings 56, the protective layers 50 are formed such that the upper end portions thereof are located above the upper surface of the insulating cover layer 11.

In this manner, the suspension board with circuit 1 in the third embodiment is obtained.

The suspension board with circuit 1 thus obtained is then shipped and stored until the slider 4 and the piezo-elements 5 are mounted thereon.

Then, by the same procedure as in the second embodiment, the slider 4 and the piezo-elements 5 are mounted on the suspension board with circuit 1.

The third embodiment allows the same function/effect as obtained in the second embodiment described above to be obtained.

(Modification)

The shape of each of the terminal openings 49 is not limited to a generally rectangular shape. The terminal opening 49 can also have, e.g., a generally circular shape or a generally triangular shape. In that case, each of the piezo-terminals 34 formed to be recessed downward into the terminal openings 49 can also be formed to have a shape corresponding to the shape of each of the terminal openings 49.

In the first and second embodiments described above, each of the protective layers 50 is formed to have a width and a length (length in the front-rear direction) smaller than those of each of the piezo-terminals 34. However, the protective layer 50 can also be formed to have a width and a length (length in the front-rear direction) larger than those of the piezo-terminal 34 so as to cover the peripheral edge of the terminal opening 49 or 56.

The protective layers 50 may also be made of a non-conductive peelable resin. In this case, when the piezo-elements 5 are mounted on the suspension board with circuit 1, it is also possible to peel and solder the protective layers 50 and thus provide electrical connection between the piezo-terminals 34 and the terminals of the piezo-elements 5.

While the illustrative embodiments of the present invention are provided in the above description, such is for illustrative purpose only and it is not to be construed limitative. Modification and variation of the present invention which will be obvious to those skilled in the art is to be covered by the following claims.

What is claimed is:

1. A suspension board with circuit, comprising:
a metal supporting board;
an insulating base layer formed on one side of the metal supporting board in a thickness direction thereof;
a conductive layer; and
an insulating cover layer formed on the one side of the insulating base layer in the thickness direction to cover the conductive layer, wherein
either one of the insulating base layer and the insulating cover layer includes an opening extending therethrough in the thickness direction, and
the conductive layer includes a wire formed on the one side of the insulating base layer in the thickness direction, and a connection terminal electrically connected to the wire and exposed from the opening to be capable of electrical connection to an electronic element,
wherein the suspension board with circuit further comprises a protective layer for protecting the connection terminal exposed from the opening,
wherein the opening is formed in the insulating base layer so as not to overlap the metal supporting board when projected in the thickness direction,
wherein the connection terminal fills the opening, wherein the protective layer protects, from the other side thereof in the thickness direction, the connection terminal exposed to the other side thereof in the thickness direction, wherein the insulating base layer includes a recessed portion which is recessed in a peripheral edge portion of the opening from a surface of the insulating base layer which is located on the other side thereof in the thickness direction toward the one side thereof in the thickness direction, and wherein in the thickness direction, the recessed portion is located at the one side of a surface of the metal supporting board which is located on the one side thereof in the thickness direction.

2. A suspension board with circuit according to claim 1, wherein the electronic element is a piezoelectric element, and the connection terminal is displaced as a result of driving the piezoelectric element.

3. A suspension board with circuit according to claim 1, wherein the protective layer is made of a conductive material.

4. A suspension board with circuit according to claim 3, wherein the protective layer is made of a solder.

5. A suspension board with circuit according to claim 1, wherein the protective layer is placed in the recessed portion, and, in the thickness direction, the other side of the protective layer in the thickness direction is located on the other side of the surface of the metal supporting board which is located on the one side thereof in the thickness direction.

6. A suspension board with circuit according to claim 1, wherein the insulating base layer includes a depressed portion which is recessed from the one side of the insulating base layer in the thickness direction toward the other side thereof in the thickness direction and filled with the connection terminal, the opening is formed in the insulating cover layer so as to overlap the depressed portion when projected in the thickness direction, and the protective layer protects, from the one side thereof in the thickness direction, the connection terminal exposed to the one side thereof in the thickness direction.

7. A suspension board with circuit according to claim 6, wherein the protective layer is placed in the opening, and, in the thickness direction, the one side of the protective layer in the thickness direction is located at the one side of a surface of the insulating cover layer which is located on the one side thereof in the thickness direction.

* * * * *